United States Patent
Tan et al.

(10) Patent No.: US 9,503,120 B1
(45) Date of Patent: Nov. 22, 2016

(54) SIGNAL DEPENDENT SUBTRACTIVE DITHERING

(71) Applicant: Analog Devices Global, Hamilton (BM)

(72) Inventors: Zhichao Tan, Wilmington, MA (US); Khiem Quang Nguyen, Tewksbury, MA (US)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/056,315

(22) Filed: Feb. 29, 2016

(51) Int. Cl.
*H03M 3/00* (2006.01)

(52) U.S. Cl.
CPC ............... *H03M 3/328* (2013.01); *H03M 3/30* (2013.01); *H03M 3/424* (2013.01); *H03M 3/464* (2013.01)

(58) Field of Classification Search
CPC ...... H03M 3/328; H03M 3/30; H03M 3/424; H03M 3/464
USPC ........................................ 341/143, 120, 131
See application file for complete search history.

(56) References Cited

U.S. PATENT DOCUMENTS

| | | | |
|---|---|---|---|
| 6,518,904 B1 | 2/2003 | Jelonnek | |
| 6,570,518 B2 | 5/2003 | Riley et al. | |
| 6,975,257 B2 | 12/2005 | Reefman et al. | |
| 7,015,843 B2 | 3/2006 | Jelonnek | |
| 7,321,325 B2 | 1/2008 | Hsieh et al. | |
| 7,411,534 B1 * | 8/2008 | Melanson | H03M 3/332 341/131 |
| 7,460,046 B2 | 12/2008 | Di Giandomenico et al. | |
| 7,777,657 B2 | 8/2010 | Sandler et al. | |
| 7,830,289 B2 | 11/2010 | Ferri | |
| 7,961,129 B2 | 6/2011 | Ceballos et al. | |
| 8,212,700 B2 | 7/2012 | Zoso | |
| 8,339,297 B2 * | 12/2012 | Lindemann | H03M 3/334 341/131 |
| 8,514,118 B2 * | 8/2013 | Eldredge | H03M 7/3008 341/131 |
| 8,766,836 B2 * | 7/2014 | Maurino | H03M 3/328 341/131 |

OTHER PUBLICATIONS

Aziz, Pervez M., et al., "An Overview of Sigma-Delta Converters: How a 1-bit ADC achieves more than 16-bit resolution", IEEE Signal Processing Magazine, vol. 13, Issue 1, (Jan. 1996), 61-84.

* cited by examiner

*Primary Examiner* — Brian Young
(74) *Attorney, Agent, or Firm* — Schwegman Lundberg & Woessner, P.A.

(57) ABSTRACT

A sigma-delta modulator circuit selectively removes a dither signal previously added to an input of a quantizer circuit from the quantizer circuit output when addition of the dither signal causes a digital state change in the quantizer circuit output. Various examples for enabling the selective removal of the dither signal are described. In one embodiment, a second quantizer circuit provides a non-dithered output signal for comparison, by a digital comparator, with the dithered output signal. In another embodiment, a single quantizer circuit provides the dithered and non-dithered output signals in turn, for comparison. A subtraction circuit may remove the dither signal as appropriate. Embodiments enable retention of the improved limit cycle tone reduction achievable via dithering while reducing the need for circuits with increased signal headroom, and associated design complexity and power dissipation.

17 Claims, 6 Drawing Sheets

SIGNAL DEPENDENT SUBTRACTIVE DITHERING

BACKGROUND

The present disclosure relates to an improved sigma-delta modulator circuit. Sigma-delta modulator circuits are often used for analog-to-digital data conversion, but sigma-delta modulator circuits operating with low input signal values or with only DC inputs may be vulnerable to limit cycles. That is, the output spectrum may include noticeable power in spurious tones that were not present in the input signal. The tones arise because the nonlinear sigma-delta modulator circuit output bits sometimes enter a repeating pattern, resulting in signal-to-noise ratio (SNR) degradation. Commonly-assigned U.S. Pat. No. 8,766,836B2, which describes an example of a sigma delta modulator with dither, is hereby incorporated by reference in its entirety.

OVERVIEW

Figure 1:
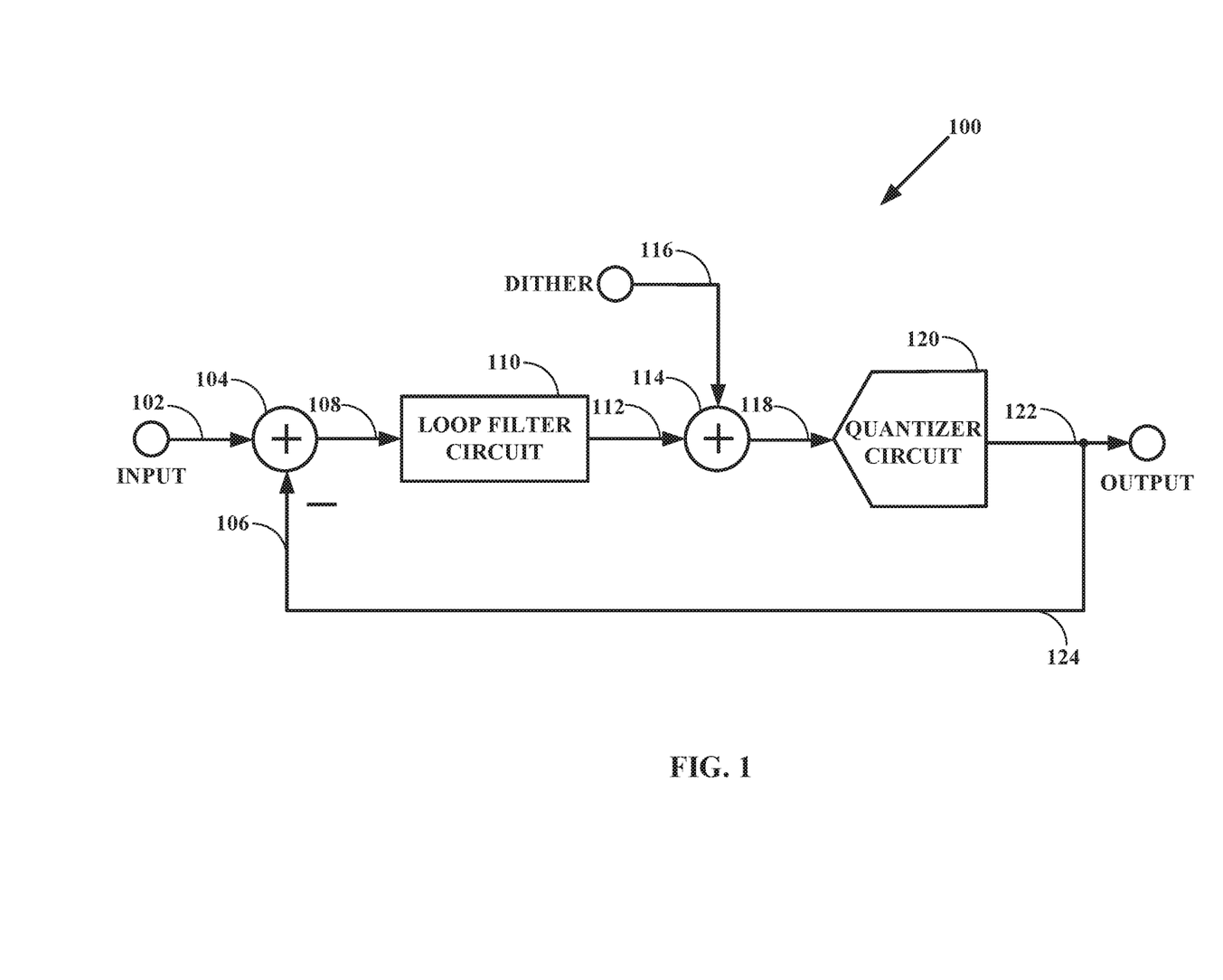
FIG. 1 shows an example of a sigma-delta modulator circuit, such as for analog-to-digital conversion.

Dither, which can be conceptualized as an intentionally applied form of noise, may be introduced to disrupt the periodicity of such generally undesired tones. In one approach to using dither, as illustrated in FIG. 1, a dither signal at node 116 may be added to the input of a first quantizer circuit 120 in a sigma-delta modulator circuit 100. The first quantizer circuit 120 generally categorizes input signals into a predetermined number of possible output states. In the simplest case, a one-bit quantizer circuit will thus output one of two digital output states depending on the input signal received, though multi-bit quantizer circuits are also possible. The addition of the dither signal at node 116 may sometimes cause a first quantizer circuit output bit to be flipped from the usual state that would otherwise occur in a non-dithered scenario, thus disrupting the periodic output pattern.

The dither signal at node 116 is shaped by the loop filter circuit 110, and so there may be relatively little dither power in the band of interest at the output of the sigma-delta modulator circuit 100. However, the added dither will nonetheless be in the feedback path 124 that typically provides a converted version of the output signal to the input of the sigma-delta modulator circuit 100, as additional quantization noise. When the dither is added, the signal swing at the loop filter circuit output at node 112 may therefore increase.

For a given maximum supported loop filter circuit output signal swing at node 112 in a given design, this effect will lead to a smaller maximum useful input signal range compared to a non-dithered sigma-delta modulator circuit. The addition of the dither may therefore impose the use of a loop filter circuit 110 with additional signal headroom. Increased headroom typically leads to higher power consumption, and may for example require additional amplifier circuit stages to be used when power supply voltages are low.

Figure 2:
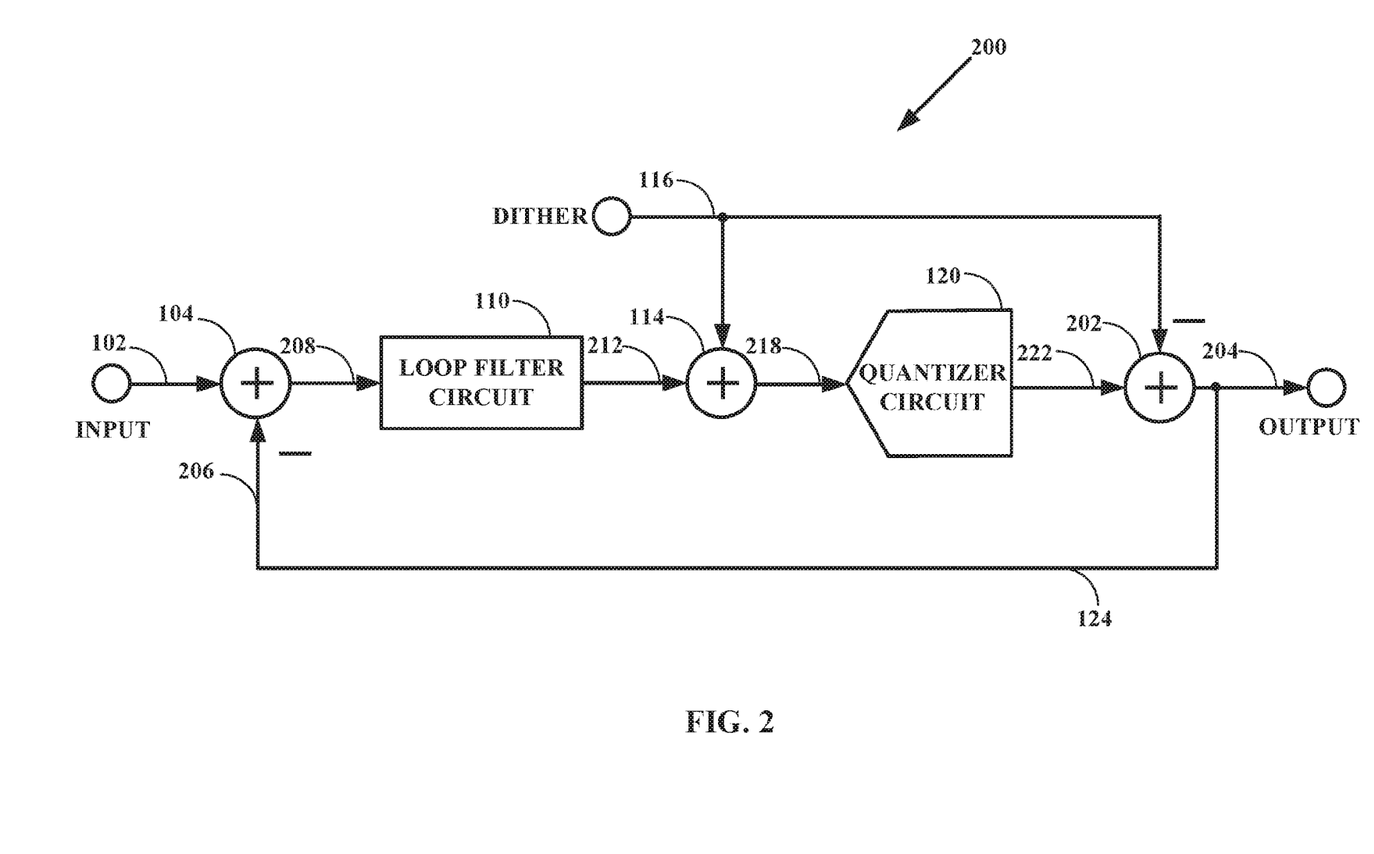
FIG. 2 shows an example of a modified sigma-delta modulator circuit with constant dither subtraction, such as for reducing loop filter circuit swing

In one approach to addressing this problem, the added dither signal at node 116 can be removed at the output of the first quantizer circuit 120 in a sigma-delta modulator circuit 200 before the dither signal at node 116 is output and fed back, such as shown in FIG. 2.

The present inventors have recognized, among other things, that sigma-delta modulator circuits may be improved. When a quantizer circuit has enough possible output states, the addition of a dither signal can change the output state of the quantizer circuit. However, the quantizer circuit gain can be very signal dependent when the quantizer circuit resolution is low, especially in a single-bit quantizer circuit scenario. The addition and feedback of a dither signal may thus change the behavior of a low-resolution sigma-delta modulator circuit. On the other hand, constant subtraction of the dither from the output signal that is fed back to the input of a sigma-delta modulator circuit, regardless of whether its analog counterpart would change the quantizer circuit output, may also cause SNR degradation when a coarse quantizer circuit is used.

The present subject matter may help provide a solution to this problem, for example, such as by providing an apparatus and method for monitoring the outputs of a sigma-delta modulator circuit that occurs both with and without added dither, and selectively removing the dither from the output signal when it is sufficiently influential to change the sigma-delta modulator circuit output state. For example, when the added dither changes the quantization results, a subtraction of the dither may be selectively enabled to inhibit or prevent the dither from being output and fed back to the input of the sigma-delta modulator circuit, otherwise, the dither subtraction may be selectively disabled.

In an example, an integrated circuit for sigma-delta modulation may comprise a dithered sigma-delta modulator circuit, which can add a dither signal to an input of a quantizer circuit, and a digital comparator circuit, which can selectively remove the dither signal from an output of the quantizer circuit when the dither signal causes a digital state change in the output of the quantizer circuit.

In an example, a method for sigma-delta modulation may comprise adding a dither signal to an input of a quantizer circuit in a sigma-delta modulator circuit, and selectively removing the dither signal from an output of the quantizer circuit when the dither signal causes a digital state change in the output of the quantizer circuit.

In an example, a system for sigma-delta modulation may comprise means for adding a dither signal to an analog input of a quantizer circuit in a sigma-delta modulator circuit, and means for selectively removing the dither signal from a quantizer output signal provided by the quantizer circuit, when the dither signal causes a digital state change in the quantizer output signal.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1 shows an example of a sigma-delta modulator circuit 100, such as for analog-to-digital conversion. An input signal at node 102 may be provided to a first subtraction circuit 104. The subtraction circuit 104 can be implemented as an "adder circuit" that is a general signed summation circuit, with use of the terms "adder circuit" and "subtraction circuit" selected to more clearly emphasize an aspect of circuit operation. For example, the first subtraction circuit 104 may add the input signal at node 102 to its output but may also subtract a feedback signal at node 106, to be described, from its output. The first subtraction circuit 104 may provide an adjusted input signal at node 108, comprising the input signal at node 102 minus the feedback signal at node 106.

The first subtraction circuit 104 may be electrically coupled to a loop filter circuit 110, and may provide the adjusted input signal at node 108 to the loop filter circuit 110 as an input to be filtered. The loop filter circuit 110 may filter the adjusted input signal at node 108 and provide a loop filter output signal at node 112. The loop filter circuit 110 may comprise any desired filter circuit type such as an analog filter or a switched-capacitor filter.

The loop filter circuit 110 may be electrically coupled to an adder circuit 114, and may provide the loop filter output signal at node 112 to the adder circuit 114 as an input to be added. The adder circuit 114 may also receive a dither signal at node 116 as an additional input to be added to the loop filter output signal at node 112 to provide a dithered loop filter output signal at node 118.

The adder circuit 114 may be electrically coupled to a first quantizer circuit 120 and may provide the dithered loop filter output signal at node 118 as an input to be quantized. The first quantizer circuit 120 may comprise any desired quantizer circuit type, such as a one-bit quantizer or a multi-bit quantizer. The first quantizer circuit 120 may categorize the loop filter output signal at node 112 into one of a predetermined number of output states, and provide a dithered output signal at node 122 as the output signal of the sigma-delta modulator circuit 100.

The first quantizer circuit 120 may be electrically coupled to a feedback path 124, which may provide a converted-to-analog version of the dithered output signal at node 122 (e.g., using a digital-to-analog converter circuit, not shown, in the feedback path 124) to the first subtraction circuit 104 as the feedback signal at node 106. For clarity, the assembled circuitry that processes the input signal at node 102 into the dithered output signal at node 122 without feedback path 124 may be described as an input circuit path. The sigma-delta modulator circuit 100 may thus be described as including the input circuit path and the feedback path 124.

FIG. 2 shows an example of a modified sigma-delta modulator circuit 200 with constant dither subtraction, such as can help reduce loop filter circuit swing requirements. The modified sigma-delta modulator circuit 200 is generally similar to the sigma-delta modulator circuit 100 of FIG. 1, but includes additional circuitry. The additional circuitry may include a second subtraction circuit 202 that may subtract and thus remove the dither signal at node 116 from the dithered output signal 222 provided by the first quantizer circuit 120. The FIG. 2 sigma-delta modulator circuit 200 thus may provide an output signal at node 204 that is different from the output signal at node 122 of FIG. 1. The sigma-delta modulator circuit 200 of FIG. 2 can also include an electrically coupled feedback path 124 that may provide the output signal at node 204 to the first subtraction circuit 104 after appropriate data conversion into a feedback signal at node 206. Note that the FIG. 2 feedback signal at node 206 may therefore be different from the feedback signal at node 106 of FIG. 1.

FIG. 2 thus depicts a sigma-delta modulator circuit 200 that attenuates or removes the dither signal at node 116 from the dithered output signal at node 222 of its first quantizer circuit 120, regardless of the value of the input signal at node 102 and the dither signal at node 116. The sigma-delta modulator circuit 200 therefore can provide signal independent dither subtraction. Further details of sigma-delta modulator circuit 200 construction and operation are provided in U.S. Pat. No. 8,766,836B2, which is incorporated by reference.

Figure 3:
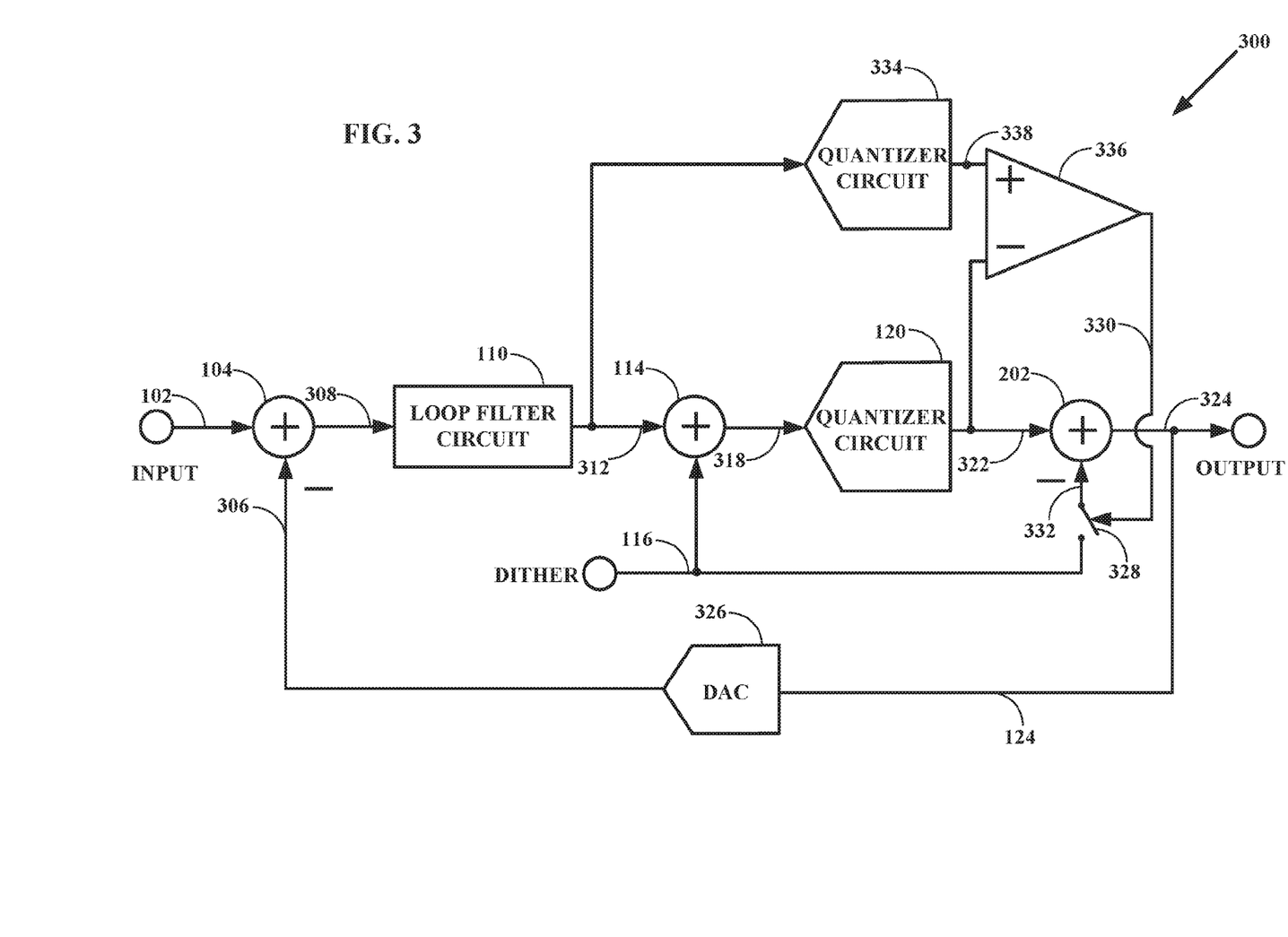
FIG. 3 shows an example of an improved sigma-delta modulator circuit with signal dependent dither subtraction, such as for analog-to-digital conversion.

FIG. 3 shows an example of an improved sigma-delta modulator circuit 300 that can provide signal dependent dither subtraction, such as for analog-to-digital conversion. The inventors have recognized, among other things, that making a dither subtraction signal dependent instead of signal independent can be particularly useful for sigma-delta modulator circuits with low-resolution quantizers, e.g., those that use single bit quantizer circuits. Sigma-delta modulator circuits with low-resolution quantizers are desirable for their ease of implementation, low cost, and usefulness for many purposes involving high resolution data conversion such as of relatively low bandwidth signals.

FIG. 3 shows an input signal at node 102 that may be provided to a first subtraction circuit 104. The first subtraction circuit 104 may add the input signal at 102 but also subtract a feedback signal at node 306. The first subtraction circuit 104 may provide an adjusted input signal at node 308, comprising the input signal at node 102 minus the feedback signal at node 306.

The first subtraction circuit 104 may be electrically coupled to a loop filter circuit 110, and may provide the adjusted input signal at node 308 to the loop filter circuit 110 as an input to be filtered. The loop filter circuit 110 may filter the adjusted input signal at node 308 and provide a loop filter output signal at node 312. The loop filter circuit 110 may comprise any desired filter circuit type, such as an analog continuous time filter or a switched-capacitor or other discrete-time filter.

The loop filter circuit 110 may be electrically coupled to an adder circuit 114, and may provide the loop filter output signal at node 312 to the adder circuit 114 as an input to be added. The adder circuit 114 may also receive a dither signal at node 116 as an additional input to be added to provide the loop filter output signal at node 312.

The adder circuit 114 may be electrically coupled to a first quantizer circuit 120 and may provide a dithered loop filter output signal at node 318 as an input to be quantized. The first quantizer circuit 120 may include any desired quantizer circuit type, such as a one-bit quantizer or a multi-bit quantizer. The first quantizer circuit 120 may categorize the loop filter output signal at node 312 into one of a predetermined number of output states, and provide a dithered output signal at node 322 to electrically coupled second subtraction circuit 202.

The second subtraction circuit 202 may subtract and thus remove the dither signal at node 116 from the dithered output signal at node 322 provided by the first quantizer circuit 120. However, in this embodiment the dither subtraction may be selective, such as described herein. In FIG. 3, the sigma-delta modulator circuit 300 thus may provide an output signal at node 324 that is different from the output signal at node 122 of FIG. 1 and the output signal at node 204 of FIG. 2.

FIG. 3 can also include an electrically coupled feedback path 124 that may provide the output signal at node 324 to the first subtraction circuit 104, such as after appropriate data conversion into a feedback signal at node 306. A digital-to-analog converter circuit 326 may perform the data conversion. In FIG. 3, feedback signal at node 306 may be different from the feedback signal at node 106 of FIG. 1 and the feedback signal at node 206 of FIG. 2.

The second subtraction circuit 202 may be electrically coupled to the dither signal at node 116 via a switch circuit 328, such as may be activated by a control signal at node 330. For example, when the control signal at node 330 is active, the switch circuit 328 outputs a switch signal at node 332 that is equal to the dither signal at node 116 as an input to the second subtraction circuit 202. However, when the control signal at node 330 is not active, the switch circuit 328 does not provide the dither signal at node 116 as an input to the second subtraction circuit 202. That is, the switch signal at node 332 may be zero when the control signal is not active. The control signal at node 330 thus determines whether dither subtraction is active, enabling signal dependent selective dither subtraction.

For clarity, the assembled circuitry that processes the input signal at node 102 into the output signal at node 324 without feedback path 124 may be described as an input circuit path. The sigma-delta modulator circuit 300 may include the input circuit path and the feedback path 124.

Different approaches can be used for providing the control signal at node 330 that enables selective dither subtraction. However, selective activation of the dither subtraction feature is particularly useful when adding dither causes the sigma-delta modulator circuit 300 to change its output signal at node 324 from what it would otherwise be if dither were not added. That is, when the dither signal at node 116 causes a digital state change to occur in the dithered output signal at node 322 of the first quantizer circuit 120, the activation of selective dither subtraction is particularly advantageous.

In FIG. 3, additional electrically coupled circuitry comprising a second quantizer circuit 334 and a digital comparator circuit 336 may provide the control signal at node 330, and thus enable the selective dither subtraction feature. The second quantizer circuit 334 may receive the loop filter output signal at node 312 as an input to be quantized. Note that the loop filter output signal at node 312 does not contain the dither signal at node 116. The second quantizer circuit 334 may therefore provide a non-dithered output signal at node 338. The non-dithered output signal at node 338 may be the same as the dithered output signal at node 322, or it may be different from the dithered output signal at node 322, depending on the level of influence that dither signal at node 116 has on the quantization process.

The digital comparator circuit 336 may compare the received non-dithered output signal at node 338 from the second quantizer 334 with the received dithered output signal at node 322 from the first quantizer circuit 120. The digital comparator circuit 336 may provide the control signal at node 330 based on the comparison, with the control signal at node 330 being activated when the two received inputs are different. When the two received inputs are the same, the digital comparator circuit 336 may deactivate the control signal at node 330, so the dither signal at node 116 is not removed because its addition causes no digital state change in the dithered output signal at node 322.

This permits substantially simultaneous comparison of the non-dithered output signal at node 338 and the dithered output signal at node 322, using the second quantizer circuit 334 and the digital comparator circuit 336. If the quantizer circuit 120 and 334 are low-resolution quantizers, the added cost or space may not be significant.

Figure 4:
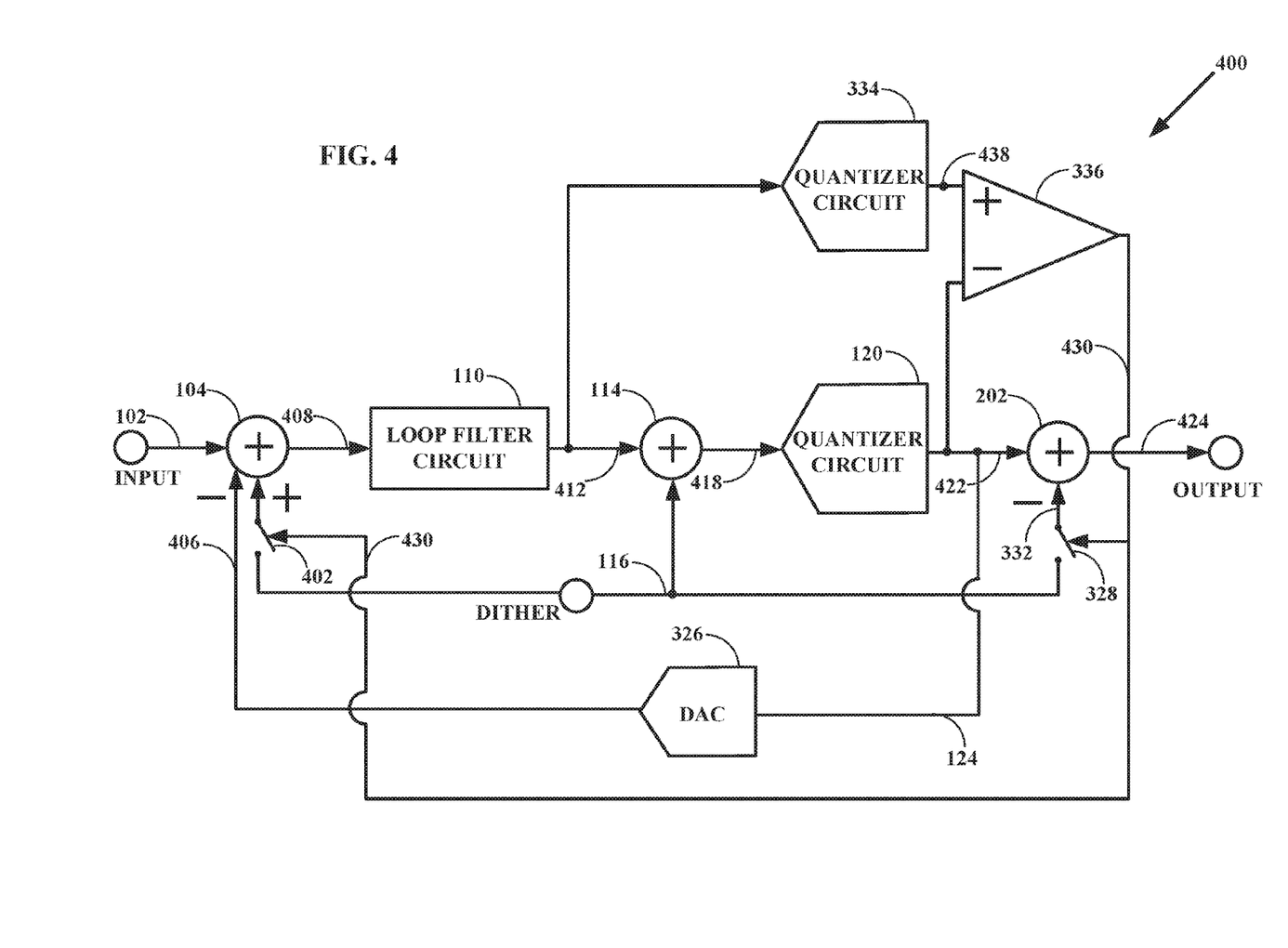
FIG. 4 shows an example of an improved sigma-delta modulator circuit with signal dependent dither subtraction and addition, such as for analog-to-digital conversion.

FIG. 4 shows an example of an improved sigma-delta modulator circuit 400 with signal dependent dither subtraction and addition, such as for analog-to-digital conversion. This circuit is similar to that of FIG. 3 but may further selectively add the dither signal at node 116 to the adjusted input signal at node 408 based on the control signal 430. The dither signal at node 116 may for example selectively pass through a second switch circuit 402 and be added in by the first subtraction circuit 104 (or a separate adder circuit) when the control signal 430 is active. The dither signal at node 116 may not be added in by the first subtraction circuit 104 when the control signal 430 is not active. The selective addition of the dither signal at node 116 to the adjusted input signal at node 408 may further increase the influence of the dither signal.

FIG. 4 shows the input signal at node 102 that may be provided to the first subtraction circuit 104. The first subtraction circuit 104 may add the input signal at 102 but also subtract a feedback signal at node 406. The first subtraction circuit 104 may provide an adjusted input signal at node 408, comprising the input signal at node 102 minus the feedback signal at node 406 plus, selectively, the dither signal at node 116, based on the control signal 430.

The first subtraction circuit 104 may be electrically coupled to a loop filter circuit 110, and may provide the adjusted input signal at node 408 to the loop filter circuit 110 as an input to be filtered. The loop filter circuit 110 may filter the adjusted input signal at node 408 and provide a loop filter output signal at node 412. Note that the loop filter output signal at node 412 may be different from the loop filter output signal at node 312 of FIG. 3, because of the selective addition of the dither signal at node 116 to the adjusted input signal at node 408. The loop filter circuit 110 may comprise any desired filter circuit type, such as an analog continuous time filter or a switched-capacitor or other discrete-time filter.

The loop filter circuit 110 may be electrically coupled to the adder circuit 114, and may provide the loop filter output signal at node 412 to the adder circuit 114 as an input to be added. The adder circuit 114 may also receive the dither signal at node 116 as an additional input to be added to provide the loop filter output signal at node 412.

The adder circuit 114 may be electrically coupled to a first quantizer circuit 120 and may provide a dithered loop filter output signal at node 418 as an input to be quantized. The first quantizer circuit 120 may include any desired quantizer circuit type, such as a one-bit quantizer or a multi-bit quantizer. The first quantizer circuit 120 may categorize the loop filter output signal at node 412 into one of a predetermined number of output states, and provide a dithered output signal at node 422 to electrically coupled second subtraction circuit 202.

The second subtraction circuit 202 may subtract and thus remove the dither signal at node 116 from the dithered output signal at node 422 provided by the first quantizer circuit 120. As with the circuit of FIG. 3, the dither subtraction may be selective, such as described herein. In FIG. 4, the sigma-delta modulator circuit 400 thus may provide an output signal at node 424 that is different from the output signal at node 122 of FIG. 1, the output signal at node 204 of FIG. 2, and the output signal at node 324 of FIG. 3.

FIG. 4 can also include an electrically coupled feedback path 124 that may provide the signal at node 422 to the first subtraction circuit 104, such as after appropriate data conversion into a feedback signal at node 406. The digital-to-analog converter circuit 326 may perform the data conversion. Note also that in this example the feedback signal originates at node 422, prior to the selective subtraction of the dither signal by the second subtraction circuit 202 which produces the output signal at node 424. In FIG. 4, the feedback signal at node 406 may be different from the feedback signal at node 106 of FIG. 1, the feedback signal at node 206 of FIG. 2, and the feedback signal at node 324 of FIG. 3.

The second subtraction circuit 202 may be electrically coupled to the dither signal at node 116 via the switch circuit 328, such as may be activated by a control signal at node 430. For example, when the control signal at node 430 is active, the switch circuit 328 outputs a switch signal at node 332 that is equal to the dither signal at node 116 as an input to the second subtraction circuit 202. However, when the control signal at node 430 is not active, the switch circuit 328 does not provide the dither signal at node 116 as an input to the second subtraction circuit 202. That is, the switch signal at node 332 may be zero when the control signal 430 is not active. The control signal at node 430 thus determines whether dither subtraction is active, enabling signal dependent selective dither subtraction.

For clarity, the assembled circuitry that processes the input signal at node 102 into the output signal at node 424 without feedback path 124 may be described as an input circuit path. The sigma-delta modulator circuit 400 may include the input circuit path and the feedback path 124.

Different approaches can be used for providing the control signal at node 430 that enables selective dither subtraction. However, selective activation of the dither subtraction feature is particularly useful when adding dither causes the sigma-delta modulator circuit 400 to change its output signal at node 424 from what it would otherwise be if dither were not added. That is, when the dither signal at node 116 causes a digital state change to occur in the dithered output signal at node 422 of the first quantizer circuit 120, the activation of selective dither subtraction is particularly advantageous.

In FIG. 4, additional electrically coupled circuitry comprising the second quantizer circuit 334 and the digital comparator circuit 336 may provide the control signal at node 430, and thus enable the selective dither subtraction feature. The second quantizer circuit 334 may receive the loop filter output signal at node 412 as an input to be quantized. Note that the loop filter output signal at node 412 does not contain the dither signal at node 116, but it does contain a filtered version of the dither signal at node 116 which was selectively added upstream (based on the control signal 430). The second quantizer circuit 334 may therefore provide a relatively non-dithered output signal at node 438. The relatively non-dithered output signal at node 438 may be the same as the dithered output signal at node 422, or it may be different from the dithered output signal at node 422, depending on the overall level of influence that dither signal at node 116 has on the quantization process.

The digital comparator circuit 336 may compare the received relatively non-dithered output signal at node 438 from the second quantizer 334 with the received dithered output signal at node 422 from the first quantizer circuit 120. The digital comparator circuit 336 may provide the control signal at node 430 based on the comparison, with the control signal at node 430 being activated when the two received inputs are different. When the two received inputs are the same, the digital comparator circuit 336 may deactivate the control signal at node 430, so the dither signal at node 116 is not removed (and in this example is also not added to the input) because its addition causes no digital state change in the dithered output signal at node 422.

This permits substantially simultaneous comparison of the relatively non-dithered output signal at node 438 and the dithered output signal at node 422, using the second quantizer circuit 334 and the digital comparator circuit 336. If the quantizer circuit 120 and 334 are low-resolution quantizers, the added cost or space may not be significant.

Figure 5:
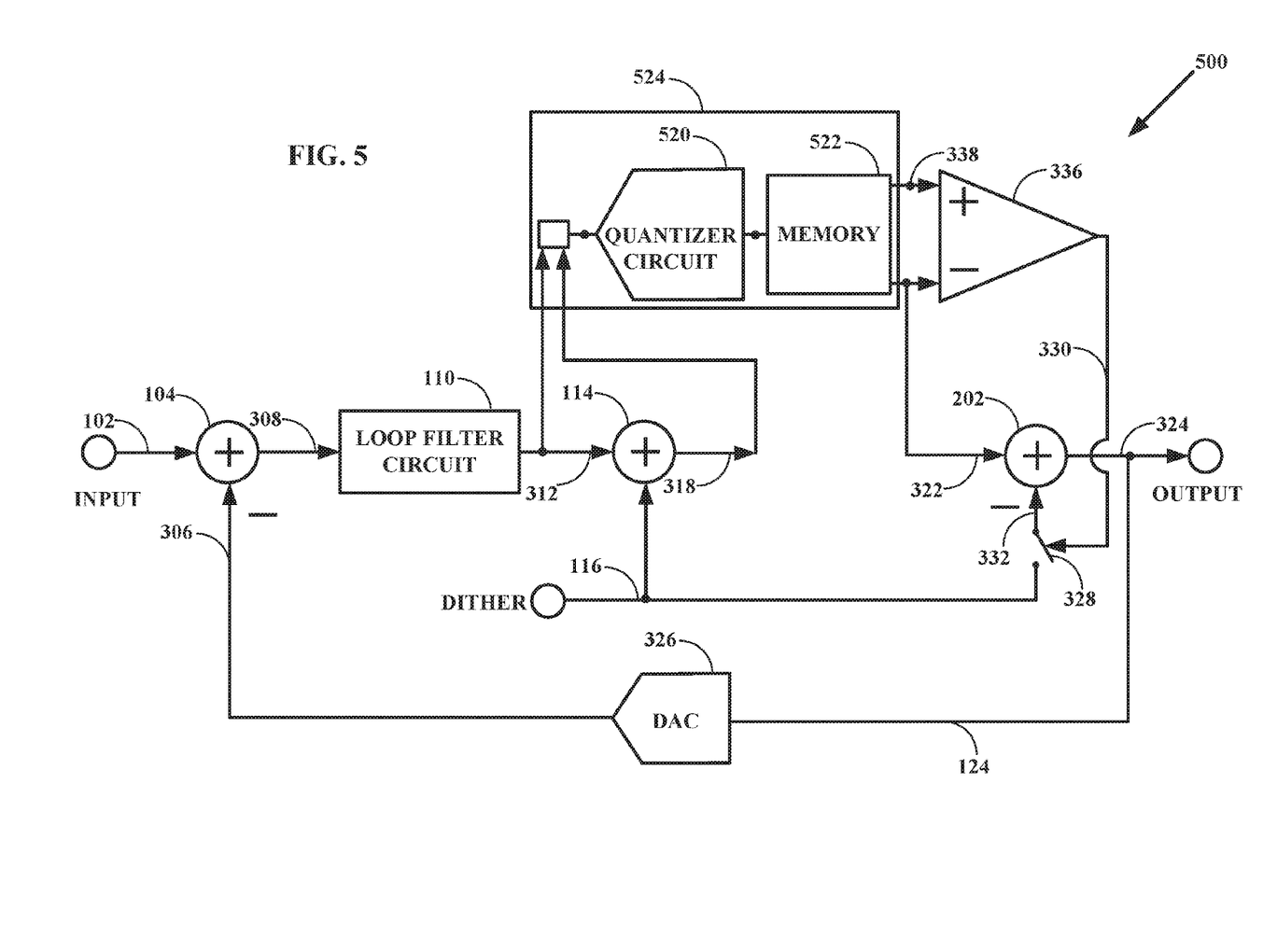
FIG. 5 shows an example of an improved sigma-delta modulator circuit with a toggled single quantizer and signal dependent dither subtraction, such as for analog-to-digital conversion.

FIG. 5 shows an example of an improved sigma-delta modulator circuit 500 with a toggled single quantizer and signal dependent dither subtraction, such as for analog-to-digital conversion. This circuit is similar to that of FIG. 3 but may use only one quantizer instead of two. A single quantizer circuit 520 may in turn quantize the non-dithered loop filter output signal at node 312 to provide the non-dithered output signal at node 338, and quantize the dithered loop filter output signal at node 318 to provide the dithered output signal at node 322. A toggling circuit 524 may for example toggle between one input signal to be processed and its corresponding output signal, and another input signal to be processed and the other corresponding output signal. At least one of the non-dithered output signal provided at node 338 and the dithered output signal provided at node 322 can be stored in a memory circuit 522, such as for the comparison by the digital comparator circuit 336. The single-quantizer approach described for FIG. 5 may also be applied to the circuit of FIG. 4.

Figure 6:
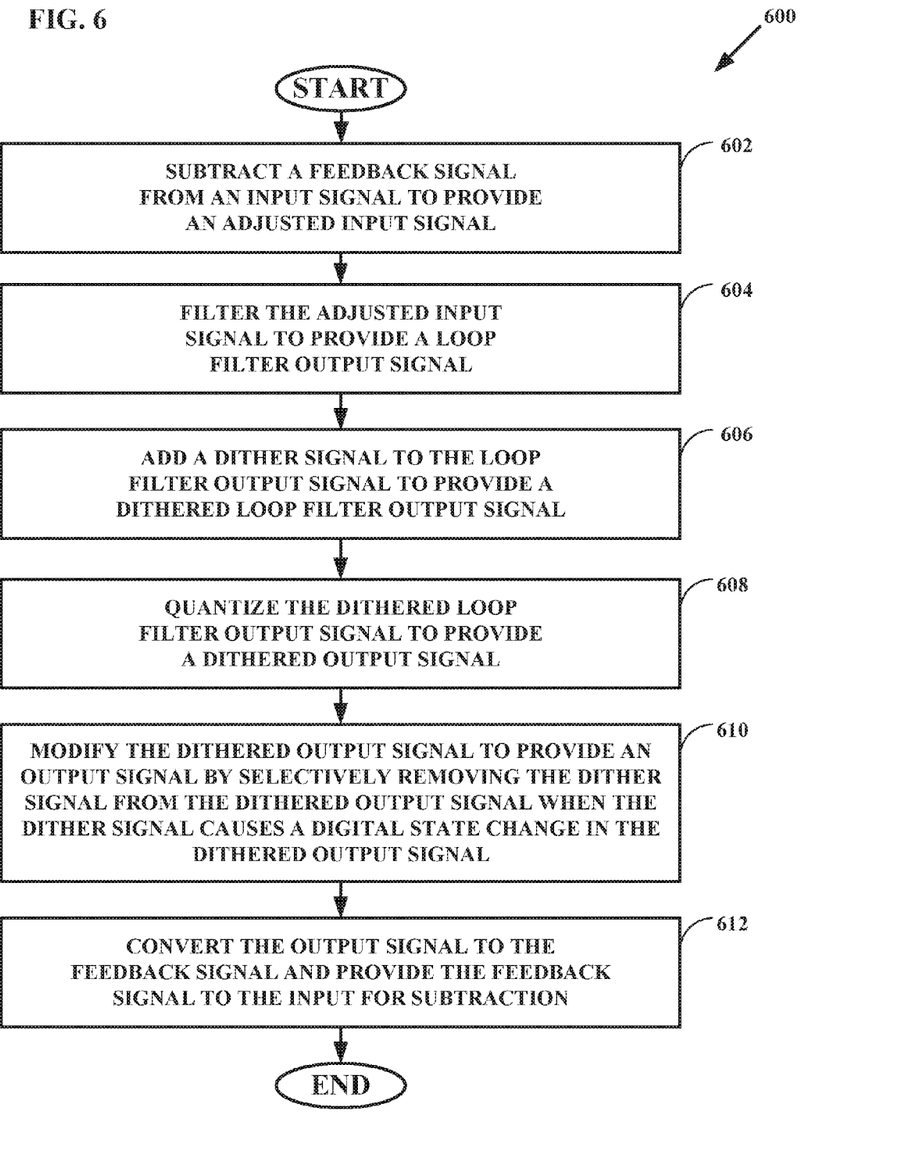
FIG. 6 shows an example of an improved sigma-delta modulation method with signal dependent dither subtraction, such as for analog-to-digital conversion.

FIG. 6 shows an example of an improved sigma-delta modulation method 500 with signal dependent dither subtraction, such as for analog-to-digital conversion. The various operations may be performed by dedicated hardware circuitry, or may be performed by a processor circuit that can execute program instructions stored in a processor-readable medium. At 602, the method may subtract a feedback signal from an input signal and provide an adjusted input signal to a coupled loop filter circuit, for example using a first subtraction circuit. At 604, the method may filter the adjusted input signal and provide a loop filter output signal to a coupled adder circuit, for example using the loop filter circuit. At 606, the method may add a dither signal to the loop filter output signal and provide a dithered loop filter output signal to a coupled first quantizer circuit, for example using the adder circuit.

At 608, the method may quantize the dithered loop filter output signal and provide a dithered output signal to a coupled digital-to-analog converter circuit and a coupled digital comparator circuit, for example using the first quantizer circuit. At 610, the method may modify the dithered output signal to provide an output signal by selectively removing the dither signal from the dithered output signal when the addition of the dither signal causes a digital state change in the dithered output signal, for example using the digital comparator circuit. At 612, the method may convert the output signal to the feedback signal and provide the feedback signal to the first subtraction circuit, for example using the digital-to-analog converter circuit.

The modifying may suppress removing the dither signal from the dithered output signal when the addition of the dither signal causes no digital state change in the dithered output signal.

The removing may for example be performed by a second subtraction circuit, in an example.

The method may further comprise quantizing the loop filter output signal to provide a non-dithered output signal for comparison with the dithered output signal to determine if the addition of the dither signal causes a digital state change in the dithered output signal, for example using a second quantizer circuit, in an example.

In an example, a single quantizer circuit may separately provide the non-dithered output signal and the dithered output signal in turn, and store at least one of these signals in a memory such as for subsequent comparison by the digital comparator circuit.

The exemplary embodiments described above may include or use subject matter such as an apparatus, a method, a means for performing acts, or a device readable medium including instructions that, when performed by the device, can cause the device to perform acts, such as performing analog-to-digital conversion of an input signal. Each of these non-limiting embodiments may stand on its own, or may be combined in various permutations or combinations with one or more of the other embodiments.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An integrated circuit for sigma-delta modulated analog-to-digital conversion, the integrated circuit comprising:
    a dithered sigma-delta modulator circuit, including an analog signal input receiving an analog input signal and a dither signal input receiving a dither signal; and
    a digital comparator circuit, coupled to the sigma-delta modulator circuit to receive a quantizer output signal, the digital comparator circuit providing an output signal by selectively removing the dither signal from the quantizer output signal when the dither signal causes a digital state change in the quantizer output signal.

2. The integrated circuit of claim 1 wherein the digital comparator circuit performs the removing using a subtraction circuit.

3. The integrated circuit of claim 1 wherein the digital comparator circuit does not remove the dither signal from the quantizer output signal when the dither signal causes no digital state change in the quantizer output signal.

4. The integrated circuit of claim 1 wherein the sigma-delta modulator circuit further includes:

a feedback subtraction circuit subtracting an analog feedback signal from the analog input signal and providing an adjusted input signal to a coupled loop filter circuit, the loop filter circuit providing a loop filter output signal to a coupled adder circuit, the adder circuit adding the dither signal to the loop filter output signal and providing a dithered loop filter output signal to a quantizer circuit, the quantizer circuit quantizing the dithered loop filter output signal and providing the quantizer output signal; and a digital-to-analog converter circuit converting the output signal to the analog feedback signal.

5. The integrated circuit of claim 4 wherein the quantizer circuit further separately quantizes the loop filter output signal to provide a non-dithered quantizer output signal, a memory circuit stores at least one of the quantizer output signal and the non-dithered quantizer output signal, and the digital comparator circuit compares the quantizer output signal and the non-dithered quantizer output signal.

6. The integrated circuit of claim 4 further comprising a second quantizer circuit that quantizes the loop filter output signal to provide a non-dithered quantizer output signal for comparison with the quantizer output signal to determine if the dither signal causes a digital state change in the quantizer output signal.

7. The integrated circuit of claim 4 wherein the feedback subtraction circuit selectively adds the dither signal to the adjusted input signal when the dither signal causes the digital state change in the quantizer output signal, and wherein the digital-to-analog converter circuit converts the quantizer output signal to the analog feedback signal.

8. The integrated circuit of claim 7 wherein the feedback subtraction circuit does not add the dither signal to the adjusted input signal when the dither signal causes no digital state change in the quantizer output signal.

9. A method for sigma-delta modulation, the method comprising:

adding a dither signal to an analog input of a quantizer circuit in a sigma-delta modulator circuit; and selectively removing the dither signal from a quantizer output signal provided by the quantizer circuit, when the dither signal causes a digital state change in the quantizer output signal wherein the removing does not remove the dither signal from the quantizer output signal when the dither signal causes no digital state change in the quantizer output signal.

10. The method of claim 9 wherein the removing further includes subtracting the dither signal from the quantizer output signal, using a subtraction circuit.

11. The method of claim 9 further including:

subtracting an analog feedback signal from an analog input of the sigma-delta modulator circuit and providing an adjusted input signal to a loop filter circuit, using a feedback subtraction circuit;

filtering the adjusted input signal and providing a loop filter output signal to an adder circuit, using the loop filter circuit;

quantizing the dithered loop filter output signal and providing the quantizer output signal to a digital-to-analog converter circuit and a digital comparator circuit, using the quantizer circuit; and converting the quantizer output signal to the feedback signal and providing the feedback signal to the feedback subtraction circuit, using the digital-to-analog converter circuit.

12. The method of claim 11 wherein:

the adding further includes adding the dither signal to the loop filter output signal and providing the dithered loop filter output signal to the quantizer circuit, using the adder circuit; and the removing further includes modifying the quantizer output signal, using the digital comparator circuit.

13. The method of claim 11 further including:

separately quantizing the loop filter output signal to provide a non-dithered output signal, using the quantizer circuit;

storing at least one of the quantizer output signal and the non-dithered output signal, using a coupled memory circuit; and comparing the quantizer output signal and the non-dithered quantizer output signal, using the digital comparator circuit.

14. The method of claim 11 further including quantizing the loop filter output signal to provide a non-dithered quantizer output signal for comparison with the quantizer output signal to determine if the dither signal causes a digital state change in the quantizer output signal, using a second quantizer circuit.

15. The method of claim 11 wherein the adding further includes selectively adding the dither signal to the adjusted input signal when the dither signal causes the digital state change in the quantizer output signal.

16. The method of claim 15 wherein the dither signal is not added to the adjusted input signal when the dither signal causes no digital state change in the quantizer output signal.

17. A system for sigma-delta modulation, the system comprising:

means for adding a dither signal to an analog input of a quantizer circuit in a sigma-delta modulator circuit; and means for selectively removing the dither signal from a quantizer output signal provided by the quantizer circuit, when the dither signal causes a digital state change in the quantizer output signal wherein the means for selectively removing does not remove the dither signal from the quantizer output signal when the dither signal causes no digital state change in the quantizer output signal.

* * * * *